United States Patent
Ehm et al.

(10) Patent No.: US 10,061,205 B2
(45) Date of Patent: Aug. 28, 2018

(54) REFLECTIVE OPTICAL ELEMENT

(71) Applicant: Carl Zeiss SMT GmbH, Oberkochen (DE)

(72) Inventors: Dirk Heinrich Ehm, Beckingen (DE); Moritz Becker, Stuttgart (DE); Irene Ament, Aalen (DE); Gisela Von Blanckenhagen, Aalen (DE); Joern Weber, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/433,708

(22) Filed: Feb. 15, 2017

(65) Prior Publication Data

US 2017/0160639 A1    Jun. 8, 2017

Related U.S. Application Data

(63) Continuation of application No. PCT/EP2015/068306, filed on Aug. 7, 2015.

(30) Foreign Application Priority Data

Aug. 15, 2014    (DE) .................. 10 2014 216 240

(51) Int. Cl.
*G03B 27/54* (2006.01)
*G03F 7/20* (2006.01)
(Continued)

(52) U.S. Cl.
CPC .......... *G03F 7/702* (2013.01); *G02B 5/0875* (2013.01); *G02B 5/0891* (2013.01);
(Continued)

(58) Field of Classification Search
CPC .................. G03F 7/702; G21K 1/06
(Continued)

(56) References Cited

U.S. PATENT DOCUMENTS

| 4,142,006 | A | 2/1979 | Choyke et al. |
| 2005/0277208 | A1* | 12/2005 | Nakazawa ........ H01L 27/11502 438/3 |

(Continued)

FOREIGN PATENT DOCUMENTS

| WO | 2008148516 A2 | 12/2008 |
| WO | 2013174656 A2 | 11/2013 |

OTHER PUBLICATIONS

International Search Report and Written Opinion in counterpart International Application No. PCT/EP2015/068306, dated Nov. 6, 2015, 13 pages; with partial translation.

(Continued)

*Primary Examiner* — Hung Henry Nguyen
(74) *Attorney, Agent, or Firm* — Edell, Shapiro & Finnan, LLC

(57) ABSTRACT

A reflective optical element, in particular for a microlithographic projection exposure apparatus has a substrate (101), a reflection layer system (110) and a defect structure (120) of channel-shaped defects (121) which extend inward from the optical effective surface (100a), or from an interface oriented toward the substrate as far as the reflection layer system, and permit egress of hydrogen from the reflection layer system. The channel-shaped defects (121) increase a diffusion coefficient that is characteristic for the egress of the hydrogen from the reflection layer system (110) by at least 20%, in comparison to a similar layer construction without these channel-shaped defects.

20 Claims, 6 Drawing Sheets

(51) Int. Cl.
*G02B 5/08* (2006.01)
*G02B 27/00* (2006.01)

(52) U.S. Cl.
CPC ....... *G02B 27/0006* (2013.01); *G03F 7/7015* (2013.01); *G03F 7/70925* (2013.01); *G03F 7/70958* (2013.01); *G03F 2007/2067* (2013.01)

(58) Field of Classification Search
USPC ............................... 355/67–71, 77; 438/471
See application file for complete search history.

(56) References Cited

U.S. PATENT DOCUMENTS

| | | | |
|---|---|---|---|
| 2006/0216912 A1* | 9/2006 | Bristol | G21K 1/06 438/471 |
| 2009/0053465 A1 | 2/2009 | Scherg et al. | |
| 2009/0252537 A1 | 10/2009 | Choi et al. | |
| 2011/0287363 A1 | 11/2011 | Patti et al. | |
| 2014/0160455 A1 | 6/2014 | Yakunin et al. | |

OTHER PUBLICATIONS

International Preliminary Report on Patentability in counterpart International Application No. PCT/EP2015/068306, dated Mar. 2, 2017, 13 pages.
Office Action in corresponding German Application 102014216240.8, dated Feb. 26, 2015, along with English Translation.

* cited by examiner

REFLECTIVE OPTICAL ELEMENT

CROSS REFERENCE TO RELATED APPLICATIONS

This application is a Continuation of International Application No. PCT/EP2015/068306, filed on Aug. 7, 2015, which claims priority under 35 U.S.C. § 119(a) to German Patent Application No. 10 2014 216 240.8, filed on Aug. 15, 2014. The disclosures of both related applications are considered part of and are incorporated by reference into the disclosure of the present application in their respective entireties.

FIELD OF THE INVENTION

The invention relates to a reflective optical element for an optical system, in particular for a microlithographic projection exposure apparatus or for a mask inspection apparatus.

BACKGROUND

Microlithography is used for producing microstructured components, such as integrated circuits or LCDs, for example. The microlithography process is carried out in a so-called projection exposure apparatus comprising an illumination device and a projection lens. The image of a mask (reticle) illuminated by the illumination device is projected by the projection lens onto a substrate (for example a silicon wafer) coated with a light-sensitive layer (photoresist) and arranged in the image plane of the projection lens, in order to transfer the mask structure to the light-sensitive coating of the substrate.

Mask inspection apparatus are used for the inspection of reticles for microlithographic projection exposure apparatus.

In projection lenses or inspection lenses designed for the EUV range, i.e. at wavelengths of e.g. approximately 13 nm or approximately 7 nm, owing to the lack of availability of suitable light-transmissive refractive materials, reflective optical elements are used as optical components for the imaging process.

In order to avoid, during operation of a projection exposure apparatus, inter alia a loss of reflection of the reflective optical components as a consequence of contaminants entering the respective optical system, it is known to charge the immediate surroundings of the relevant reflective optical components with an atmosphere of for example hydrogen (as "purge gas"), which prevents ingress of unwanted contaminants into the optical system into the immediate surroundings of these reflective optical components.

In practice, however, the problem arises that this (ionic or atomic) hydrogen penetrates into the multi-layer system (in particular for example a reflection layer system present on the substrate of the reflective optical components and consisting of an alternating sequence of molybdenum (Mo) and silicon (Si) layers), where the hydrogen reacts for example with the silicon, forming volatile silicon hydride (silane), or recombines to molecular hydrogen. These processes lead to an enrichment of gas phases within the reflection layer system and are therefore associated with an increase in volume and "swelling of the layer", which can ultimately lead to delamination as a consequence of "spalling" of layers of the multi-layer system, and thus to a loss of reflectivity or even destruction of the reflective optical element.

The measurement images shown in FIGS. 6A-6B serve to illustrate the above-described problem of delamination as a consequence of penetrating hydrogen, FIG. 6A showing "bubble formation" in the multi-layer system (referred to as a "blister") caused by the above-described increase in volume, and FIG. 6B showing delamination resulting therefrom.

SUMMARY

The present invention has as one object providing a reflective optical element, in particular for a microlithographic projection exposure apparatus or for a mask inspection apparatus. A further, more specific object is to avoid, as much as possible, impairment of the reflection properties or destruction of the reflective optical element by hydrogen accumulated during operation of the optical system.

This object is achieved, according to one formulation of the invention, by a reflective optical element for an optical system, which has an optical effective surface and which comprises:
  a substrate;
  a reflection layer system; and
  a defect structure of channel-shaped defects which extend inward from the optical effective surface, or from an interface oriented toward the substrate, as far as the reflection layer system, and permit egress of hydrogen from the reflection layer system;
  wherein the channel-shaped defects increase, by at least 20%—in comparison to a similar layer construction without these channel-shaped defects—a diffusion coefficient that is characteristic for the egress of hydrogen from the reflection layer system.

According to another formulation the invention makes use of the idea of preventing the process, described in the introduction, of an increase in volume or "bubble formation" associated with the accumulation of hydrogen in the multi-layer system, by introducing a defect structure of channel-shaped defects into the reflective optical element, and thus creating suitable "outlets" for the hydrogen from the reflective optical element or the reflection layer system thereof. In other words, the invention still accepts the ingress of hydrogen into the reflective optical element or the multi-layer system thereof, but at the same time provides for easier egress of the hydrogen from the reflective optical element or the reflection layer system thereof by increasing the transport of hydrogen out of the reflection layer system via the channel-shaped defects of the defect structure according to the invention.

In this context, the channel-shaped defects serve to increase the likelihood of hydrogen escaping from the reflection layer system by providing for the hydrogen—which typically penetrates into the reflective optical element perpendicular to the optical effective surface and then spreads laterally within the reflective optical element—a plurality of "channels" or "outlets" that extend for example essentially perpendicular to the optical effective surface, with the consequence that the effective diffusion coefficient of the entire system is increased.

In that context, the invention makes use of the realization that facilitated ingress of hydrogen into the reflective optical element or the reflection layer system thereof, which is directly associated with the above-described defect structure according to the invention, can be accepted since at the same time the hydrogen can more easily escape, thus avoiding the chemical reactions of the hydrogen, for example with the silicon within the reflection layer system, or recombination to molecular hydrogen, which have been described in the introduction and lead to delamination.

According to one embodiment, the channel-shaped defects are formed by nanotubes, in particular carbon nanotubes. Here, the invention makes use of the fact that carbon nanotube coatings of this type can be made in an ordered fashion and with nanotube lengths that lie in the order of magnitude of the depths to which the hydrogen penetrates into the multi-layer system of the reflective optical element in the processes described in the introduction.

Merely by way of example, the maximum length of the channel-shaped defects in the defect structure, which can for example be provided using carbon nanotubes of this type, can be at least 30 nm, in particular at least 50 nm, more particularly at least 100 nm. Furthermore, at least one or even all of the channel-shaped defects can extend through the entire thickness of the reflection layer system.

By virtue of the formulation according to which the channel-shaped defects of the defect structure according to the invention are formed by nanotubes, in particular carbon nanotubes, the present application is intended to encompass embodiments in which the relevant (e.g. carbon) material of the nanotubes remains in the channel-shaped defects when the optical system is brought into operation, and also embodiments in which this material is removed prior to operation by using cleaning steps (e.g. using atomic hydrogen as is for example known from WO 2008/148516 A2).

According to one embodiment, nanotubes of the nanotube coating are provided with at least one protective layer prior to deposition of the reflection layer system. It is thus possible to avoid contamination effects along the nanotubes.

Furthermore, the invention is not restricted to creating the channel-shaped defects of the inventive defect structure using (in particular carbon) nanotubes.

In other embodiments of the invention, channel-shaped defects can be generated also using suitable diaphragm structures during deposition of the multi-layer system. A channel-shaped defect is to be understood here as any interruption in the multi-layer system that has a certain extent vertically with respect to the optical effective surface, such that a plurality of layers which lie below the optical effective surface are in direct contact with the vacuum environment of the respective mirror.

In other embodiments, the defect structure can also be created, after deposition of the reflection layer system, by localized ion beam etching to create the channel-shaped defects. This makes it possible, in particular, to create the channel-shaped defects or hole channels for the defect structure at selected locations. In that context, the outlet end of the channel-shaped defects or hole channels can lie at the upper (in the direction of the optical effective surface) or also at the lower interface of the reflection layer system. Furthermore, the channel-shaped defects can also be created as through-channels (in particular through the entire reflection layer system).

According to one embodiment, a getter material is provided, at least in certain regions, along the channel walls bounding the channel-shaped defects. A getter material of this type can in particular be designed to trap any oxygen ($O_2$) that might be present in the residual gas. The getter material can in particular contain titanium (Ti), zirconium (Zr) or silicon (Si).

According to one embodiment, the channel-shaped defects of the defect structure are introduced from that side of the reflective optical element that is oriented away from the optical effective surface, or from the back of the mirror. While the functionality of the defect structure is fundamentally the same (when compared to a defect structure proceeding from the optical effective surface), this has the advantage that the optical effective surface or mirror surface remains undisturbed and thus, overall, the apparition of imaging errors or stray light losses is reduced.

In other embodiments, it is also possible, during the coating process when creating the reflective optical element, for a targeted inclusion of flaws on the substrate or in the multi-layer system of the optical element to take place in order to thus promote localized irregularities in the subsequent layer growth. With the aid of suitable subsequent treatment, for example treatment with wet-chemical methods or dry etching methods, it is thus possible to create, in a targeted manner, localized interruptions in the multi-layered system that have a certain extent vertically with respect to the optical effective surface.

According to one embodiment, the channel-shaped defects increase, by at least 40% and more particularly by at least 50% in comparison to a similar layer construction without these channel-shaped defects, a diffusion coefficient that is characteristic for the egress of hydrogen from the reflection layer system.

According to one embodiment, the maximum length of the channel-shaped defects in the defect structure is at least 30 nm, in particular at least 50 nm, more particularly at least 100 nm.

According to one embodiment, at least one of the channel-shaped defects extends through the entire thickness of the reflection layer system.

According to one embodiment, the channel-shaped defects are arranged spaced apart from one another such that they form a diffraction grating for diffracting an unwanted spectral range (e.g. the infrared radiation of a $CO_2$ laser of a plasma light source) in the direction of an absorber surface which is located outside the beam path used for the projection exposure.

The invention also relates to a method for producing a reflective optical element for an optical system, in particular for a microlithographic projection exposure apparatus, wherein the reflective optical element has a substrate, a reflection layer system and an optical effective surface, wherein the reflection layer system is provided with a defect structure of channel-shaped defects which extend inward from the optical effective surface, or from an interface oriented toward the substrate, as far as the reflection layer system, and promote egress of hydrogen from the reflection layer system by increasing a diffusion coefficient that is characteristic for the egress of hydrogen from the reflection layer system.

With regard to advantages and preferred embodiments of the method, reference is made to the preceding statements in conjunction with the reflective optical element according to the invention.

The invention also relates to an optical system of a microlithographic projection exposure apparatus, in particular to a collector unit (e.g. an EUV light source), an illumination device or a projection lens, and to a microlithographic projection exposure apparatus having at least one reflective optical element with the above-described features.

Further configurations of the invention may be gathered from the description and the dependent claims.

The invention is explained in greater detail below on the basis of exemplary embodiments illustrated in the accompanying figures.

DETAILED DESCRIPTION

Figure 1:
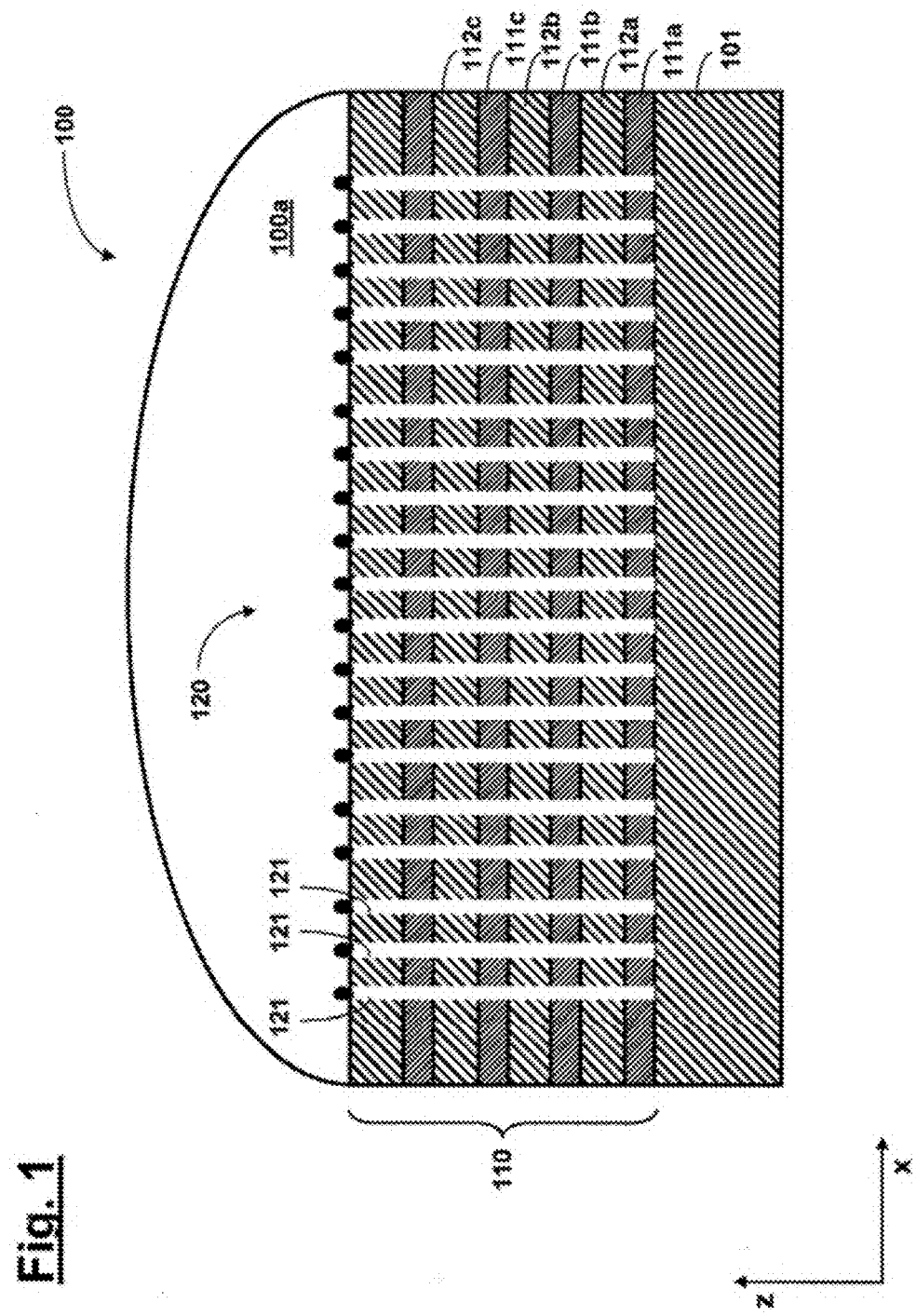
FIGS. 1-2: show schematic illustrations for elucidating the construction of a reflective optical element according to one embodiment of the invention.

FIG. 1 shows a schematic illustration for elucidating the construction of a reflective optical element 100 according to the invention (e.g. a mirror of an EUV projection exposure apparatus) according to one embodiment.

The reflective optical element 100 has, in a manner known per se on a substrate 101 of any suitable substrate material, a reflection layer system 110 which, purely by way of example (and without the invention being restricted to certain materials), can have a sequence of silicon (Si) layers 111a, 111b, 111c, . . . and molybdenum (Mo) layers 112a, 112b, 112c, . . . .

The reflective optical element 100 also has, as illustrated purely schematically and in a highly simplified manner in FIG. 1, a defect structure 120 of channel-shaped defects 121 which extend from the optical effective surface 100a into the reflection layer system 110. Although the illustrated exemplary embodiment shows these channel-shaped defects 121 extending over the entire thickness of the reflection layer system 110 as far as the substrate 101, the invention is not restricted thereto.

In other exemplary embodiments, it is also possible for the channel-shaped defects 121 to extend only over a part region of the reflective optical element 100, in which case the defect structure 120 can be provided in particular only to a certain depth in the reflection layer system 110 and/or only in a part region of the reflection layer system 110 relative to the lateral extent thereof.

Insofar as said depth of the channel-shaped defects 121 is concerned, this can be chosen in particular so as to adapt to typical expected penetration depths of the hydrogen into the reflection layer system 110, such penetration depths potentially having values of the order of magnitude of 30 nm, again on the basis of experimental data (as illustrated e.g. in FIG. 4), without the invention being restricted thereto.

Figure 4:
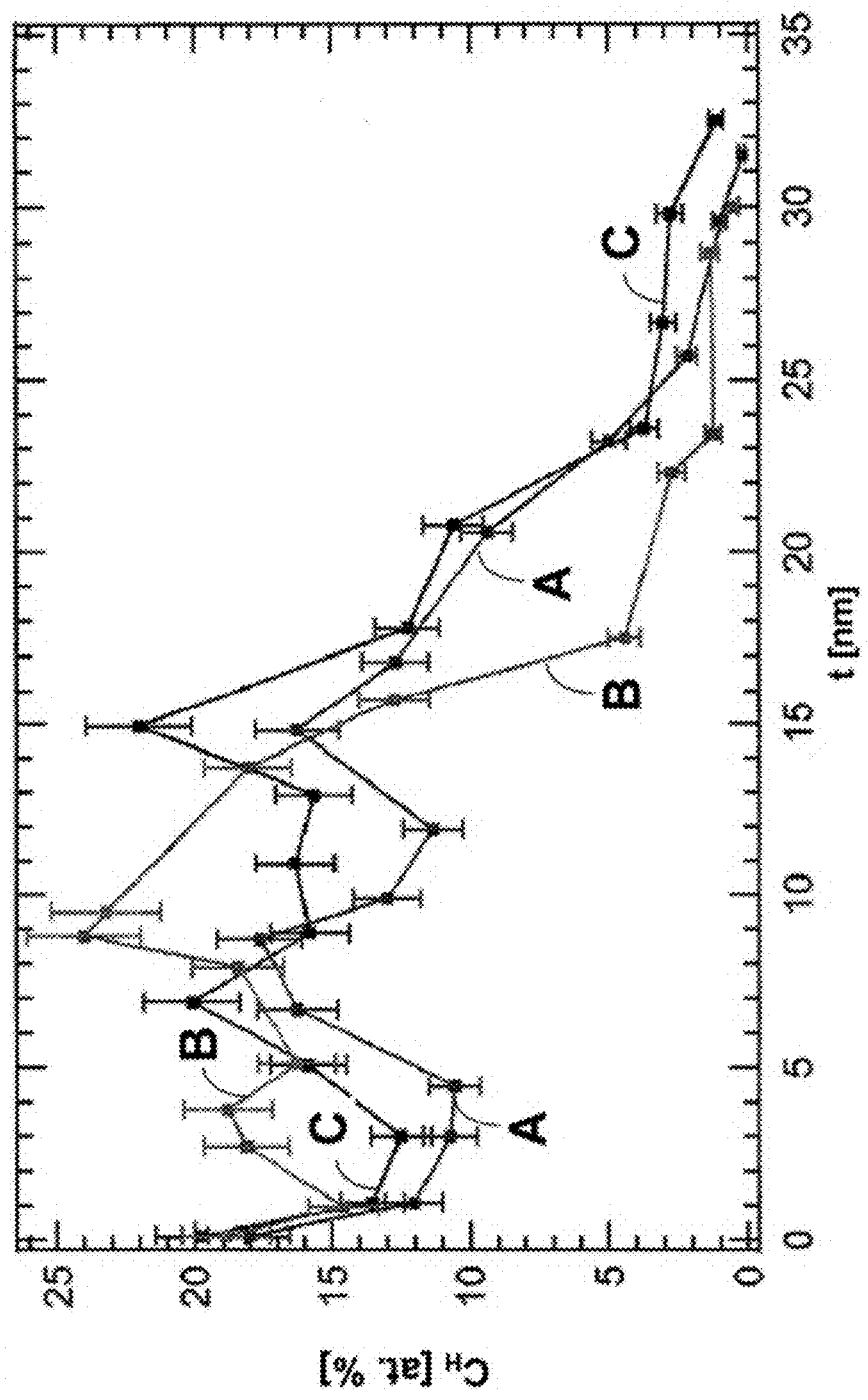
FIG. 4: shows a diagram for elucidating exemplary hydrogen penetration depths into a reflective optical element according to the invention.

While, fundamentally, solely on the basis of the kinetic energy of the hydrogen ions the resulting penetration depths into the multi-layer system of a reflective optical element are not all that great (hydrogen ions with kinetic energy of 100 eV having typical penetration depths of approximately 5-10 nm), when diffusion effects are taken into account the hydrogen can penetrate to depths of up to 50 nm into the multi-layer system 110 of the reflective optical element 100. As can be seen in FIG. 4, experimental data shows that the hydrogen concentration $C_H$ is inversely proportional to depth in the multi-layer system of a reflective optical element. Various samples show first of all a local maximum in the region of approximately 15 nm and, after the hydrogen concentration has dropped, another peak at approximately 30 nm. It can be inferred from this that a depth of the channel-shaped defects 121 of approximately (30-50) nm should generally be sufficient to adequately support the egress of hydrogen that has penetrated into the multi-layer system of the reflective optical element 100, and thus effectively avoid the delamination described in the introduction.

Figure 2:
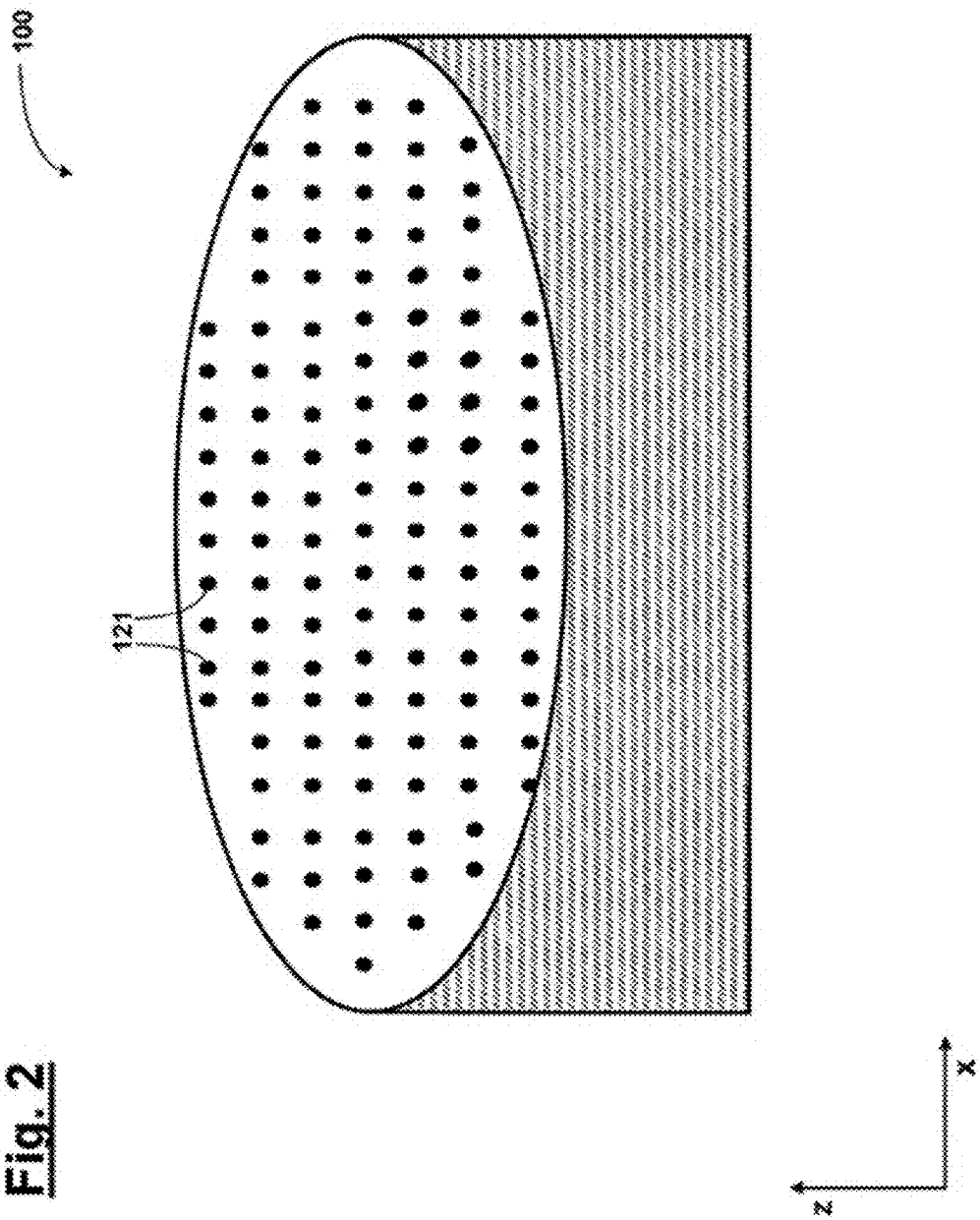

FIG. 2 shows, in a purely schematic, perspective manner, the distribution of the defect structure 120 over the optical effective surface 100a of the reflective optical element 100. The spacing of the channel-shaped defects 121 of the defect structure 120, or the surface coverage density of the channel-shaped defects 121, can be chosen in a suitable manner taking into account the optical specification limits of the reflective optical element 100. In other words, both the number and the size of the channel-shaped defects 121 are suitably chosen so as to avoid any significant impairment of the optical performance (in particular the reflectance) of the reflective optical element 100. The average diameter of the channel-shaped defects 121 can for example be, in terms of order of magnitude, in the range from one or a few nm up to approximately 25 μm. In particular, channel-shaped defects 121 or pores having diameters of a few nm have only a negligible influence on the imaging quality of a mirror and thus permit a high density of channel-shaped defects or pores.

Purely by way of example, the average diameter of the channel-shaped defects 121 can be of an order of magnitude of 1 μm, it being possible in the case of a reflective optical element 100 in the form of a facet mirror (e.g. a pupil facet mirror) for e.g. approximately 300 mirror facets each with a diameter of 1 cm to each be provided with approximately 70,000 to 75,000 channel-shaped defects. If the channel-shaped defects 121 are formed using carbon nanotubes, the corresponding process parameters for creating the carbon nanotube layer are set in an appropriate manner for that purpose.

Figure 3:
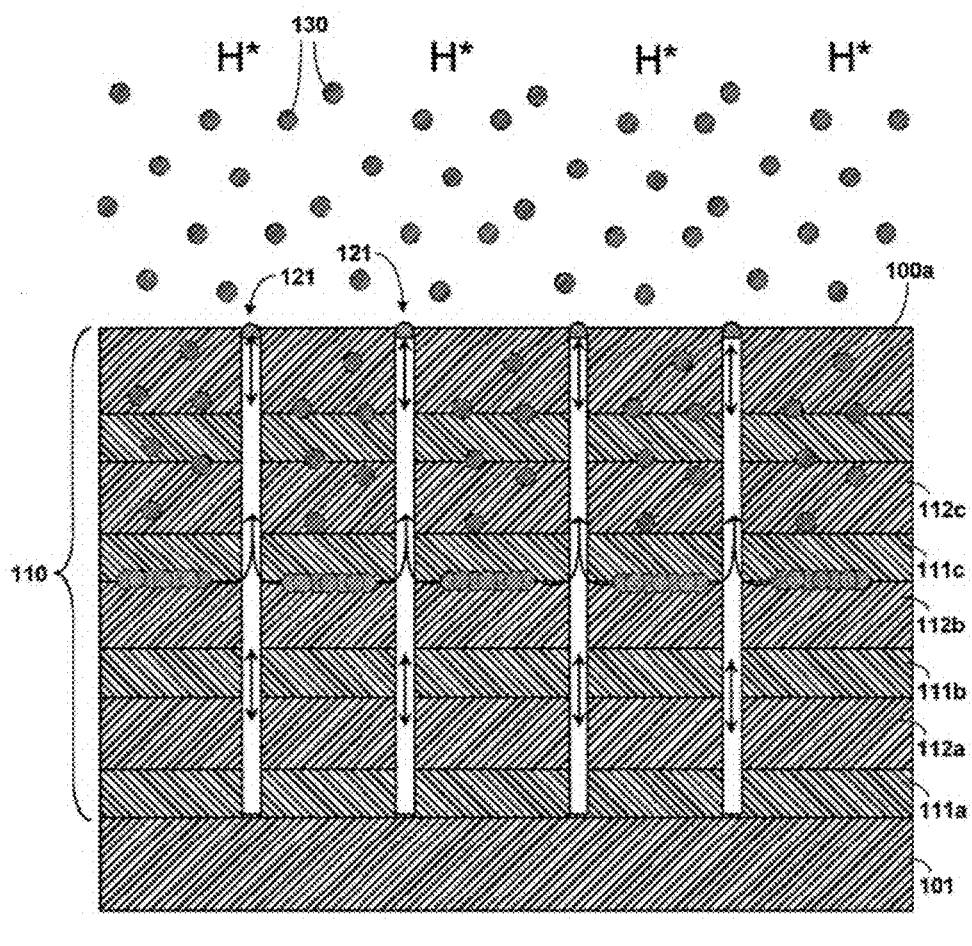
FIG. 3: shows a diagram for elucidating the mode of action of the reflective optical element according to the invention shown in FIG. 1 or 2.

FIG. 3 shows a schematic diagram for elucidating the mode of action of the defect structure 120 of channel-shaped defects 121, according to the invention. As illustrated in a purely schematic and highly simplified manner, hydrogen ions 130 which, during operation of the optical system such as an EUV projection exposure apparatus, are exposed to relatively high EUV power densities and can thus have high ion energies of for example greater than 50 eV, and in particular ion energies of several 100 eV, penetrate into the reflection layer system 110, where the hydrogen ions spread laterally, inter alia via diffusion processes. The channel-shaped defects 121 according to the invention now provide, for these hydrogen ions, an outlet that runs in a direction perpendicular to the lateral direction or to the optical effective surface 100a, via which outlet the hydrogen ions can escape in an orderly fashion from the reflection layer system 110. Consequently, accumulation of the hydrogen ions within the reflection layer system 110 is at least largely avoided, thus avoiding the reactions, described in the introduction, of the hydrogen, which as a consequence of a localized increase in volume ultimately lead to delamination (for example as a consequence of the formation of silane due to the reaction with silicon or as a consequence of the hydrogen ions recombining to molecular hydrogen).

The defect structure 120 according to the invention can be created in various ways. A first possible realization involves the deposition of a nanotube coating, in particular of carbon nanotubes, prior to or during creation of the reflection layer system 110. These carbon nanotubes can be created in manners known per se to a person skilled in the art. In that context, the corresponding nanotube coating can for example be first deposited on the substrate 101, whereupon the reflection layer system 110 can then be created in a conventional manner for example using physical vapor deposition (PVD) methods, such that the (e.g. molybdenum or silicon) layers of the reflection layer system 110 form between the carbon nanotubes.

Alternatively, the reflection layer system can also be created using the atomic layer deposition (ALD) method. Then, the carbon material of the carbon nanotubes forming the channel-shaped defects 121 can either remain in the layer construction, or can be removed in a cleaning process using suitable methods, for example based on the use of atomic hydrogen.

Although in the above-described method the channel-shaped defects 121 thus created extend ultimately over the entire thickness of the reflection layer system 110 as far as the optical effective surface 100a, wherein at the same time the method can be kept relatively simple with respect to the individual process steps by virtue of the nanotube coating being formed prior to formation of the reflection layer system 110, it is also possible in other embodiments for coating with carbon nanotubes to be carried out in an intermediate step (i.e. during the deposition of the reflection layer system 110 which may be briefly interrupted for this purpose), such that the extent of the channel-shaped defects 121 into the reflection layer system 110 can also be controlled (e.g. in order to adapt to an expected penetration depth of the hydrogen ions into the reflection layer system 110, due to the maximum ion energy at the use position of the reflective optical element).

In other embodiments, it is also possible, for creating the defect structure 120 according to the invention, to use other technologies such as the use of suitable diaphragm structures during the coating process, or the creation of the reflection layer system, or also the creation of flaws on the substrate 101 prior to deposition of the reflection layer system 110, in conjunction with post-treatment methods for the targeted creation of channel-shaped defects.

Furthermore, the defect structure can also be created, after deposition of the reflection layer system, by localized ion beam etching to create the channel-shaped defects. In this manner, the channel-shaped defects or hole channels for the defect structure can be created at locations chosen in a targeted manner. The outlet end of the channel-shaped defects or hole channels can lie at the upper (in the direction of the optical effective surface) or also at the lower interface of the reflection layer system. Furthermore, the channel-shaped defects can also be created as through-channels (in particular through the entire reflection layer system). In addition, the channel-shaped defects can also extend through the substrate, and/or egress of hydrogen can take place in part via lateral diffusion.

By virtue of the fact that the concept according to the invention is based on the provision of an (additional) defect structure of channel-shaped defects in order to facilitate egress of hydrogen from the reflection layer system, the invention in particular also allows for the fact that it is in practice almost impossible to otherwise significantly influence (for example by varying the layer parameters, in particular of the reflection layer system itself) the magnitude of the diffusion coefficient that is relevant for this egress of hydrogen. This is due to the fact that, in order to meet the required optical specifications, the freedom for example for choosing the individual layer materials when producing the layer construction in the reflective optical element is very limited and the diffusion coefficient is practically impossible to influence in that regard.

In other words, the invention accepts that the diffusion of hydrogen into the undisturbed regions of the layer stack itself is largely fixed by various parameters such as material properties and temperature, but on the other hand regions of "holes" or of localized vacuum conditions offer almost ideal transport conditions for the removal of hydrogen, for which reason such "localized vacuum conditions" are provided by the channel-shaped defects according to the invention, almost via an artificially created porosity. Such localized vacuum conditions are analogous to the "virtual leak" known in vacuum systems. In contrast to the generally unwanted effects of a virtual leak in the context of evacuation of vacuum systems (in the form of very long pumping times), the above-mentioned localized vacuum conditions are not disadvantageous for the embodiments according to the invention since in this context an equilibrium with regard to hydrogen diffusion is envisaged, and therefore the long pumping time is irrelevant.

The invention is not limited with regard to a specific (e.g. cubic, hexagonal, etc.) arrangement of the channel-shaped defects 121 within the defect structure 120 according to the invention. Thus, this defect structure 120 can also have only a short-range order of the channel-shaped defects 121, or even be chaotic.

In other embodiments of the invention, the channel-shaped defects 121 can also be used to form a diffraction grating. In this context, the channel-shaped defects 121 can be arranged with a suitable spacing with respect to one another such that a disruptive or unwanted portion of the illumination spectrum (e.g. infrared radiation of a $CO_2$ laser) can be deflected out of the used light region or used light cone (and possibly deflected onto suitable absorber surfaces outside the beam path used for the projection exposure).

Figure 5:
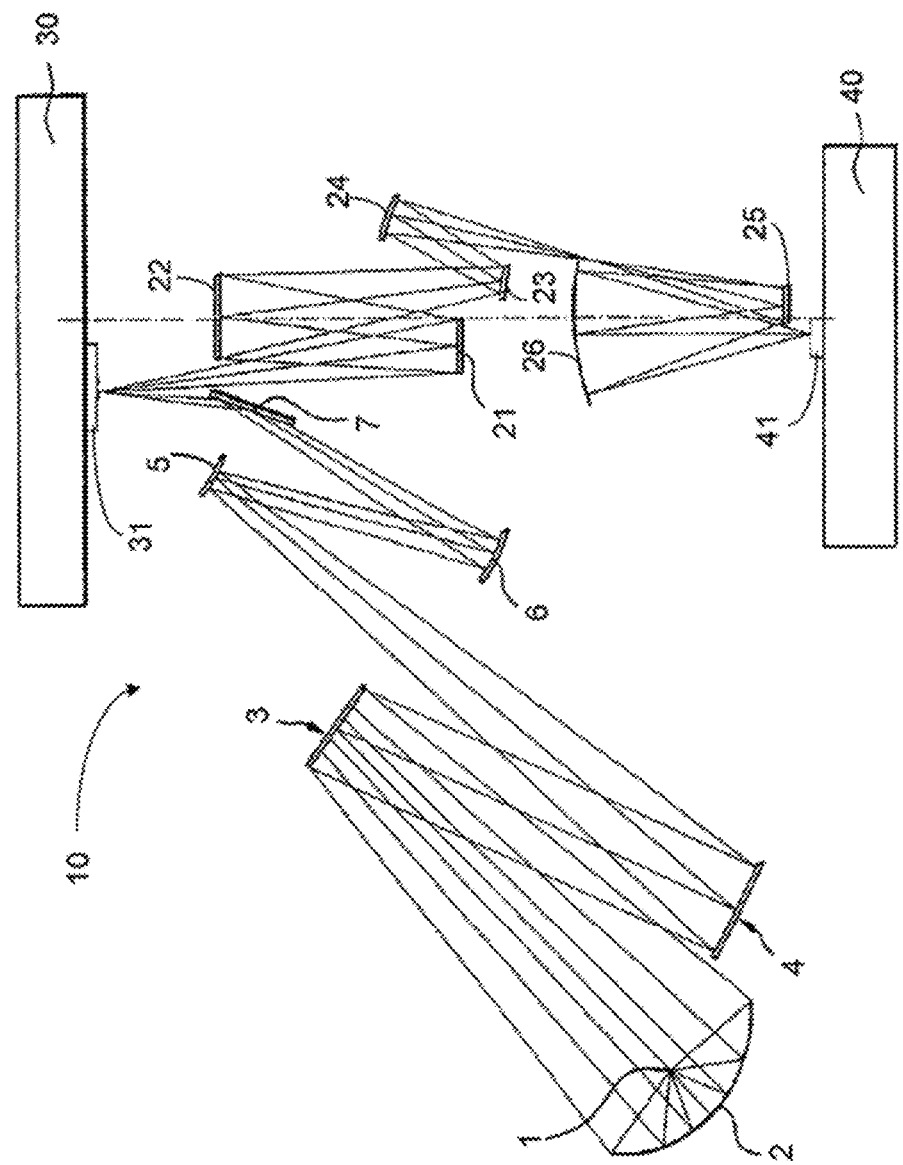
FIG. 5: shows a schematic illustration for elucidating the possible construction of a microlithographic projection exposure apparatus designed for operation in the EUV.
Figure 6A:
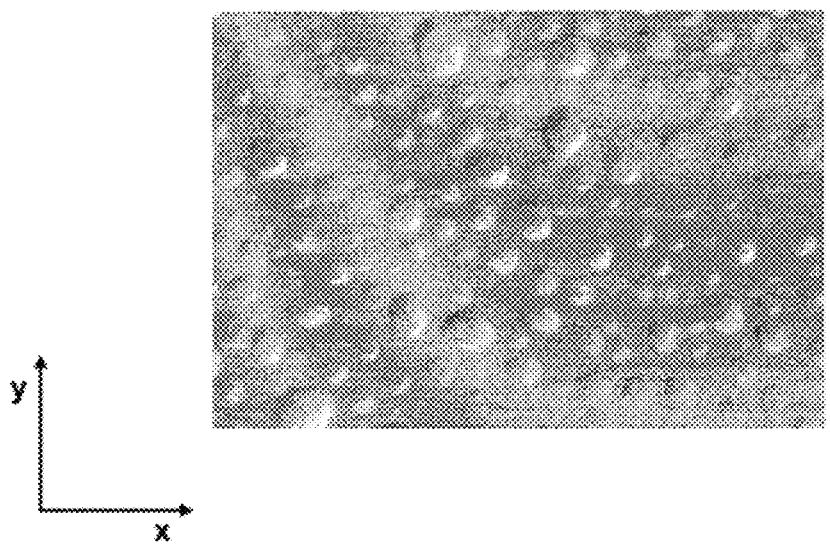
FIGS. 6A-6B: show exemplary measurement results for elucidating a problem on which the present invention is based.
Figure 6B:
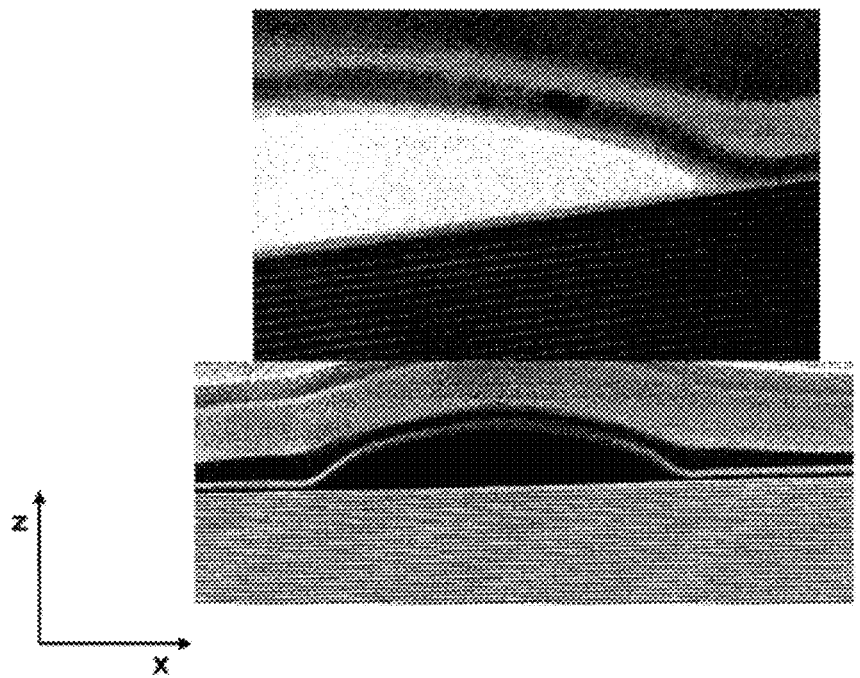

FIG. 5 shows a schematic illustration of an exemplary projection exposure apparatus which is designed for operation in EUV and which can comprise a reflective optical element according to the invention. In this context, the reflective optical element can in particular be one of the present EUV mirrors.

According to FIG. 5, an illumination device in a projection exposure apparatus 10 designed for EUV comprises a field facet mirror 3 and a pupil facet mirror 4. The light from a light source unit comprising a plasma light source 1 and a collector mirror 2 is directed onto the field facet mirror 3. A first telescope mirror 5 and a second telescope mirror 6 are arranged in the light path downstream of the pupil facet mirror 4. A deflection mirror 7 is arranged downstream in the light path, said deflection mirror directing the radiation that is incident on it onto an object field in the object plane of a projection lens comprising six mirrors 21-26. Arranged on a mask stage 30 at the location of the object field is a reflective structure-bearing mask 31, which with the aid of the projection lens is imaged into an image plane, in which there is a substrate 41 coated with a light-sensitive layer (photoresist) on a wafer stage 40.

It is in principle possible for any of the mirrors of the construction shown in FIG. 5 (e.g. the collector mirror 2 or the pupil facet mirror 4) to be configured as a reflective optical element according to the invention, that is to say with a defect structure for example according to one of the previously described embodiments. In another exemplary application, it is also possible for a reflective optical element of a mask inspection apparatus used for the inspection of reticles for microlithographic projection exposure apparatus to be configured as a reflective optical element according to the invention.

Even though the invention has been described on the basis of specific embodiments, numerous variations and alternative embodiments are evident to the person skilled in the art, e.g. through combination and/or exchange of features of individual embodiments. Accordingly, it goes without saying for the person skilled in the art that such variations and alternative embodiments are concomitantly encompassed by the present invention, and the scope of the invention is restricted only within the meaning of the appended patent claims and the equivalents thereof.

What is claimed is:

1. A method for producing a reflective optical element for a microlithographic projection exposure apparatus, wherein the reflective optical element has a substrate, a reflection layer system and an optical effective surface, comprising:
   providing the reflection layer system with a defect structure of channel-shaped defects which extend inward from the optical effective surface or from an interface oriented toward the substrate as far as the reflection layer system, wherein the channel-shaped defects have an average diameter on an order of magnitude of 1 nm;
   promoting egress of hydrogen from the reflection layer system by increasing a diffusion coefficient that is characteristic for the egress of hydrogen from the reflection layer system; and
   depositing a nanotube coating prior to or during deposition of the reflection layer system to create the defect structure;
   wherein nanotubes of the nanotube coating are provided with at least one protective layer prior to deposition of the reflection layer system.

2. A reflective optical element for a microlithographic projection exposure apparatus, wherein the reflective optical element has an optical effective surface, comprising:
   a substrate;
   a reflection layer system; and
   a defect structure of channel-shaped defects which extend into the reflection layer system from the optical effective surface, or from an interface oriented toward the substrate, and permit egress of hydrogen from the reflection layer system;
   wherein the channel-shaped defects have an average diameter on an order of magnitude of 1 nm; and
   wherein the channel-shaped defects are open to an environment exterior to the reflective optical element via a surface of the optical element other than the optical effective surface.

3. The reflective optical element as claimed in claim 2, wherein the channel-shaped defects are formed by nanotubes.

4. The reflective optical element as claimed in claim 3, wherein the channel-shaped defects are formed by carbon nanotubes.

5. The reflective optical element as claimed in claim 4, wherein the carbon nanotubes comprise at least one protective layer.

6. An optical system of a microlithographic projection exposure apparatus, comprising at least one reflective optical element as claimed in claim 2.

7. A microlithographic projection exposure apparatus comprising an illumination device and a projection lens, wherein said projection exposure apparatus comprises a reflective optical element as claimed in claim 2.

8. A reflective optical element for a microlithographic projection exposure apparatus, wherein the reflective optical element has an optical effective surface, comprising:
   a substrate;
   a reflection layer system; and
   a defect structure of channel-shaped defects which extend into the reflection layer system from the optical effective surface, or from an interface oriented toward the substrate, and permit egress of hydrogen from the reflection layer system;
   wherein the channel-shaped defects have an average diameter on an order of magnitude of 1 nm;
   wherein the channel-shaped defects are formed by carbon nanotubes; and
   wherein the carbon nanotubes comprise at least one protective layer.

9. The reflective optical element as claimed in claim 8, wherein the maximum length of the channel-shaped defects in the defect structure is at least 30 nm.

10. The reflective optical element as claimed in claim 8, wherein at least one of the channel-shaped defects extends through the entire thickness of the reflection layer system.

11. The reflective optical element as claimed in claim 8, wherein the channel-shaped defects are arranged spaced apart from one another so as to form a diffraction grating for diffracting an unwanted spectral range in the direction of an absorber surface.

12. An optical system of a microlithographic projection exposure apparatus, comprising at least one reflective optical element as claimed in claim 8.

13. A microlithographic projection exposure apparatus comprising an illumination device and a projection lens, wherein said projection exposure apparatus comprises a reflective optical element as claimed in claim 8.

14. The reflective optical element as claimed in claim 8, wherein the maximum length of the channel-shaped defects in the defect structure is at least 100 nm.

15. A method for producing a reflective optical element for a microlithographic projection exposure apparatus, wherein the reflective optical element has a substrate, a reflection layer system and an optical effective surface, comprising:
   providing the reflection layer system with a defect structure of channel-shaped defects which extend inward from the optical effective surface or from an interface oriented toward the substrate as far as the reflection layer system, wherein the channel-shaped defects have an average diameter on an order of magnitude of 1 nm,
   promoting egress of hydrogen from the reflection layer system by increasing a diffusion coefficient that is characteristic for the egress of hydrogen from the reflection layer system;
   introducing the channel-shaped defects of the defect structure from a side of the reflective optical element that is oriented away from the optical effective surface; and
   opening the channel-shaped defects to an environment exterior to the reflective optical element via the side of the reflective optical element that is oriented away from the optical effective surface.

16. The method as claimed in claim 15, further comprising using a targeted inclusion of flaws on the substrate to create the defect structure.

17. The method as claimed in claim 15, further comprising depositing a nanotube coating prior to or during deposition of the reflection layer system to create the defect structure.

18. The method as claimed in claim 15, further comprising using a diaphragm structure during deposition of the reflection layer system to create the defect structure.

19. The method as claimed in claim 15, wherein the defect structure is created after deposition of the reflection layer system, by localized ion beam etching to create the channel-shaped defects.

20. The method as claimed in claim 15, further comprising providing a getter material at least in certain regions, along the channel walls bounding the channel-shaped defects.

* * * * *